(12) United States Patent
Uchida

(10) Patent No.: US 10,470,337 B2
(45) Date of Patent: Nov. 5, 2019

(54) COOLING DEVICE AND ELECTRONIC DEVICE

(71) Applicant: FUJITSU LIMITED, Kawasaki-shi, Kanagawa (JP)

(72) Inventor: Hiroki Uchida, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/254,698

(22) Filed: Jan. 23, 2019

(65) Prior Publication Data

US 2019/0159360 A1    May 23, 2019

Related U.S. Application Data

(63) Continuation of application No. PCT/JP2016/071900, filed on Jul. 26, 2016.

(51) Int. Cl.
*H05K 7/20* (2006.01)
*H01L 23/427* (2006.01)
(Continued)

(52) U.S. Cl.
CPC ............ *H05K 7/203* (2013.01); *F25D 9/00* (2013.01); *F28D 15/02* (2013.01); *H01L 23/427* (2013.01);
(Continued)

(58) Field of Classification Search
CPC ......... H01L 2924/0002; H01L 2924/00; H01L 23/473; H01L 23/427; H01L 23/4735;
(Continued)

(56) References Cited

U.S. PATENT DOCUMENTS 2,767,693 A * 10/1956 Foutz .................. F01P 3/22
123/41.25
3,512,582 A * 5/1970 Chu ..................... H01L 23/427
165/104.27
(Continued)

FOREIGN PATENT DOCUMENTS

JP        53-457       1/1978
JP        56-42363     4/1981
(Continued)

OTHER PUBLICATIONS

International Search Report, mailed in connection with PCT/JP2016/071900 and dated Nov. 1, 2016, with English Translation (12 pages).

*Primary Examiner* — Adam B Dravininkas
(74) *Attorney, Agent, or Firm* — Fujitsu Patent Center

(57) ABSTRACT

A cooling device includes an immersion tank to store a coolant where an electronic component is immersed and cause the coolant to evaporate by heat from the electronic component into vapor, a condenser tube including a starting end to which the vapor is supplied and a termination end from which the condensed vapor is discharged, an isolating part arranged in a midway part of the condenser tube, a coolant tank to accommodate the termination end of the condenser tube and the isolating part inside and store the coolant discharged from the condenser tube, an air tube that has a starting end coupled to the coolant tank and a termination end coupled to the starting end of the condenser tube, a liquid tube to supply the coolant from the coolant tank to the immersion tank, and a steam tube to supply the vapor from the immersion tank to the condenser tube.

11 Claims, 13 Drawing Sheets

(51) Int. Cl.
*F25D 9/00* (2006.01)
*F28D 15/02* (2006.01)
*H01L 23/44* (2006.01)

(52) U.S. Cl.
CPC ......... *H01L 23/44* (2013.01); *H05K 7/20318* (2013.01); *H05K 7/20327* (2013.01); *H05K 7/20809* (2013.01); *H05K 7/20818* (2013.01)

(58) Field of Classification Search
CPC ....... H01L 23/44; H01L 23/467; H01L 35/30; H05K 7/20236; H05K 7/203; H05K 7/20809; H05K 7/20772; H05K 7/20327; H05K 7/20781; H05K 7/20; H05K 7/20818; H05K 7/20318; H05K 7/20218; H05K 7/20281; H05K 7/20381; H05K 7/20763; H05K 7/20836; H05K 5/067; G06F 1/20; G06F 2200/201; G06F 1/206; F28D 15/0266; F28D 15/02; F28D 15/00; F28D 15/0233; F28D 20/0052; F28D 7/12; F28D 1/0206; F28D 7/026; F28D 15/06

See application file for complete search history.

(56) References Cited

U.S. PATENT DOCUMENTS

| | | | | |
|---|---|---|---|---|
| 3,774,677 A * | 11/1973 | Antonetti | ............. | H01L 23/427 165/285 |
| 3,989,102 A * | 11/1976 | Jaster | ............. | F28D 15/00 165/104.31 |
| 4,352,342 A * | 10/1982 | Cser | ............. | F01P 11/028 123/41.29 |
| 4,967,832 A * | 11/1990 | Porter | ............. | H01L 23/4735 165/104.32 |
| 5,186,242 A * | 2/1993 | Adachi | ............. | B60H 1/3202 165/110 |
| 5,293,754 A * | 3/1994 | Mizuno | ............. | H01L 23/473 165/104.27 |
| 6,135,067 A * | 10/2000 | Klamm | ............. | F01P 11/0285 123/41.01 |
| 9,313,931 B2 * | 4/2016 | Goth | ............. | H05K 7/20772 |
| 9,410,751 B2 * | 8/2016 | David | ............. | F28F 27/00 |
| 2006/0007657 A1 * | 1/2006 | Pfahnl | ............. | H05K 7/20327 361/700 |
| 2008/0104970 A1 * | 5/2008 | Suzuki | ............. | F24F 5/0035 62/64 |
| 2011/0162829 A1 * | 7/2011 | Xiang | ............. | C09K 5/063 165/234 |
| 2014/0216688 A1 * | 8/2014 | Shelnutt | ............. | F28F 13/06 165/104.13 |

FOREIGN PATENT DOCUMENTS

| | | |
|---|---|---|
| JP | 56-104456 | 8/1981 |
| JP | 1-264247 | 10/1989 |
| JP | 9-162579 | 6/1997 |
| JP | 9-240263 | 9/1997 |
| JP | 2013-245875 | 12/2013 |
| JP | 2014-183107 | 9/2014 |
| JP | 2015-183901 | 10/2015 |

* cited by examiner

·······▷ : FLOW OF AIR
——▶ : FLOW OF COOLANT

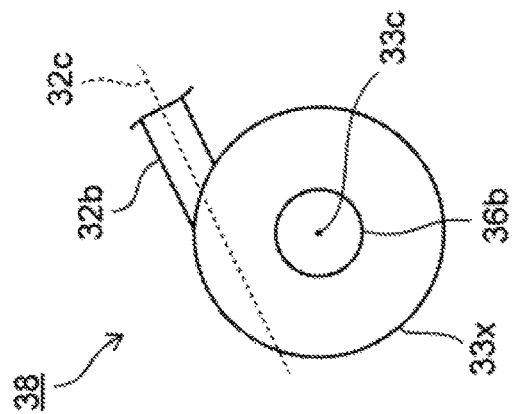
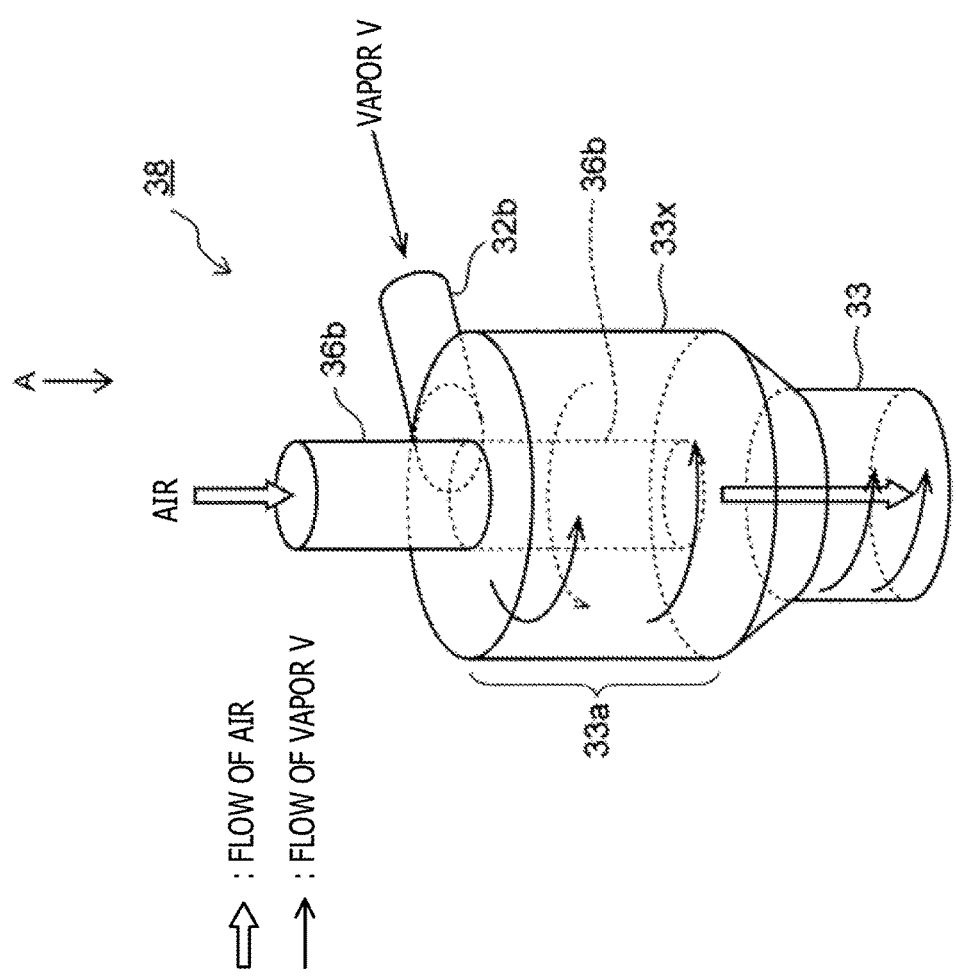

⇨ : FLOW OF AIR
→ : FLOW OF COOLANT

COOLING DEVICE AND ELECTRONIC DEVICE

CROSS-REFERENCE TO RELATED APPLICATION

This application is a continuation application of International Application PCT/JP2016/071900 filed on Jul. 26, 2016 and designated the U.S., the entire contents of which are incorporated herein by reference.

FIELD

The embodiments discussed herein are related to cooling devices and electronic devices.

BACKGROUND

As a liquid cooling scheme of cooling electronic units such as servers and supercomputers, immersion liquid cooling is used in which an electronic unit is cooled by being immersed in an insulating coolant stored in a liquid tank.

Immersion liquid cooling is classified into a single liquid phase cooling scheme and a cooling scheme using a gas-liquid phase change.

The single liquid phase cooling scheme is a scheme of cooling an electronic unit with a liquid-phase coolant without vaporization of a coolant.

In this scheme, to avoid the coolant from vaporizing with heat from an electronic component such as a central processing unit (CPU) implemented on an electronic unit, a chemosynthesis oil with a boiling point sufficiently higher than a heat generation temperature of that electronic component is used as a coolant. With the coolant circulated between a heat exchanger and a liquid tank by using a pump, the coolant cooled at the heat exchanger is supplied to the liquid tank, and the electronic unit is cooled in the liquid tank with the coolant.

However, the chemosynthesis coil has high viscosity and thus has low cooling capability. To compensate for the cooling capability, the driving force of the pump has to be increased to speed up circulation of the coolant.

If viscosity is high, it takes time for the coolant to drip down from the electronic unit when the electronic unit is drawn up from the liquid tank for maintenance, posing a problem of poor maintainability.

Meanwhile, in the cooling scheme using a gas-liquid phase change, the coolant is vaporized with heat from the electronic unit and the electronic unit is cooled with heat of vaporization. To allow the coolant to vaporize with heat from the electronic unit, the coolant for use has a low boiling point and tends to evaporate.

The coolant with a low boiling point has lower viscosity compared with the one for use in the single liquid phase cooling scheme. Thus, unlike the above, the driving force of the pump does not have to be increased and, with the coolant dripping down from the electronic unit in a short time, maintainability is favorable.

However, the cooling scheme using a gas-liquid phase change is susceptible to improvement in avoidance of the naturally-evaporated coolant from escaping into the air.

The followings are reference documents.
[Document 1] Japanese Laid-open Patent Publication Nos. 9-162579 and
[Document 2] Japanese Laid-open Patent Publication No 1-264247.

SUMMARY

According to an aspect of the embodiments, a cooling device includes an immersion tank to store a coolant where an electronic component is immersed and cause the coolant to evaporate by heat from the electronic component into vapor, a condenser tube including a starting end to which the vapor is supplied and a termination end from which the condensed vapor is discharged, an isolating part arranged in a midway part of the condenser tube, the isolating part to isolate the condensed coolant from air and take out the air to outside of the condenser tube, a coolant tank to accommodate the termination end of the condenser tube and the isolating part inside and store the coolant discharged from the condenser tube, the coolant tank including a hole through which air passes, an air tube that has a starting end coupled to the coolant tank and a termination end coupled to the starting end of the condenser tube, the air tube to supply air from the coolant tank to the condenser tube, a liquid tube to supply the coolant from the coolant tank to the immersion tank, and a steam tube to supply the vapor from the immersion tank to the condenser tube.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5A is a perspective view of a connecting part according to the first embodiment, and FIG. 5B is a top view of the connecting part according to the first embodiment when viewed from an axial direction of a condenser tube;

DESCRIPTION OF EMBODIMENTS

Prior to description of the embodiments, matters studied by the inventor are described.

Figure 1:
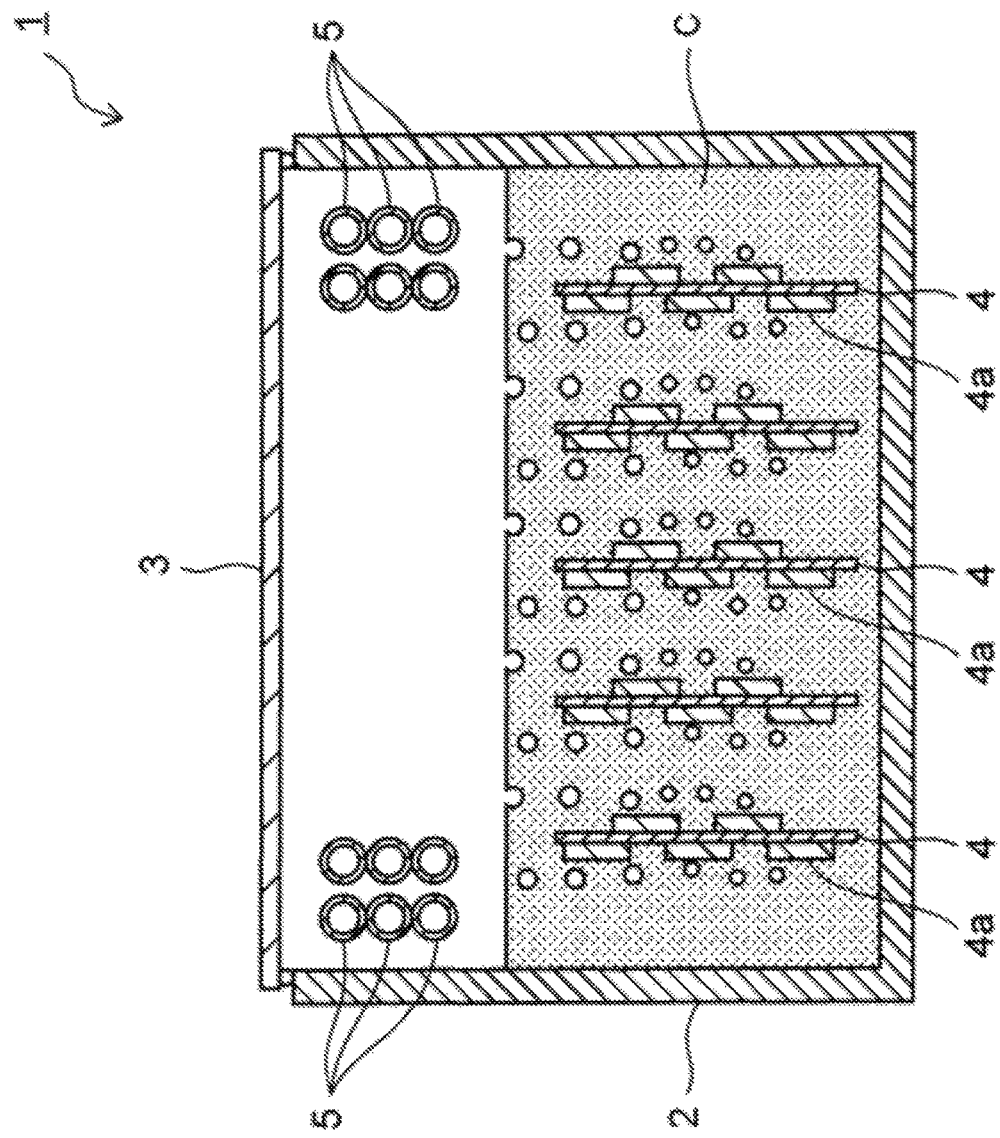
FIG. 1 is a structure diagram of a cooling device used for study by the inventor.

FIG. 1 is a structural diagram of a cooling device used for the study.

A cooling device 1 uses a gas-liquid phase change of a coolant C, and has an immersion tank 2 where the coolant C is stored and a cover 3 for hermetically sealing the inside of the immersion tank 2.

In the coolant C, circuit boards 4 for servers or supercomputers are immersed. On the circuit boards 4, electronic components 4a such as CPUs are implemented. The coolant C is vaporized with heat from the electronic components 4a.

To liquefy thus vaporized coolant C, cooling tubes 5 are provided inside the immersion tank 2. The cooling tubes 5 cool the coolant C by letting cooling water flow inside the tubes. In this example, the cooling tubes 5 are provided above the liquid surface of the coolant C. The coolant C liquefied on the outer surface of each cooling tube 5 drips down by gravity to the inside of the immersion tank 2, and thus a mechanism for circulating the coolant C inside the immersion tank 2 does not have to be used.

In the cooling device 1, as described above, the coolant C is vaporized with heat from the electronic components 4a, and the electronic components 4a are cooled with heat of vaporization. Thus, as the coolant C, a liquid having a boiling temperature lower than the heat generation temperature of the electronic components 4a is used.

For example, in Novec™ made by 3M, a product with a model number of 7000 has a boiling point of 34° C., a product with a model number of 649 has a boiling point of 49° C., and a product with a model number of 7100 has a boiling point of 61° C. Thus, when the heat generation temperature of the electronic components 4a is on the order of 80° C., Novec may be used as the coolant C.

With the use of the coolant C having a low boiling point as described above, cooling of the electronic components 4a is promoted, thereby allowing reduction in leak current of the electronic components 4a to reduce their power consumption.

However, the coolant C having a low boiling point as described above is naturally evaporated to escape into the air, and thus has to be replenished for long-term use. Specifically, the coolant C having a low boiling point such as Novec is expensive, for example, and if the coolant C is frequently replenished, the running cost of the device increases.

To avoid the coolant C from escaping into the air, it may be effective to provide the cover 3 to the immersion tank 2 as depicted in this example.

However, if the immersion tank 2 is fully hermetically sealed with the cover 3, a large pressure is applied to the immersion tank 2 due to a difference in temperature between the inside and outside of the immersion tank 2.

According to a trial calculation by the inventor, when the area of the cover 3 when viewed from above is 500 mm$^2$, if the inner temperature of the immersion tank 2 becomes higher than the outer temperature by 20° C., a force of 170 kgf is applied to the cover 3 from the inside of the immersion tank 2. This may deform or damage the immersion tank 2, and thus full-hermetic sealing of the immersion tank 2 with the cover 3 is dangerous.

To remove this danger, measures have to be taken, such as making the immersion tank 2 to be highly resistant to pressure, thereby disadvantageously increasing the device structure.

To solve this problem, the inventor has contrived another cooling device.

Figure 2:
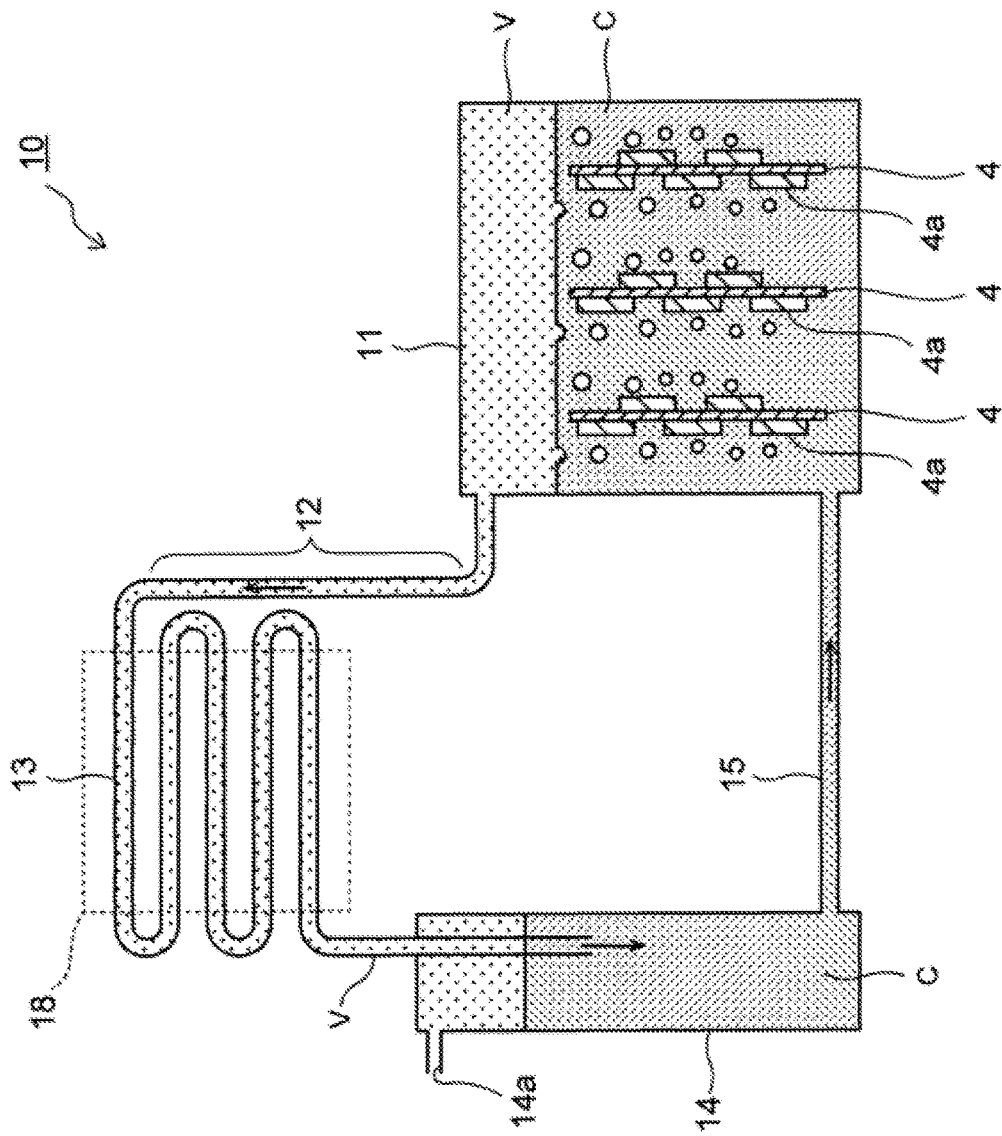
FIG. 2 is a structure diagram of a cooling device contrived by the inventor.

FIG. 2 is a structure diagram of a cooling device 10 contrived by the inventor.

The cooling device 10 uses a gas-liquid phase change of a coolant, and has an immersion tank 11, a steam tube 12, a condenser tube 13, a coolant tank 14, and a liquid tube 15.

The immersion tank 11 is a container for storing the insulating coolant C, and electronic units 4 such as circuit boards are immersed in the coolant C.

On the electronic units 4, the electronic components 4a such as CPUs which generate heat at a temperature higher than the boiling point of the coolant C are implemented. Thus, the coolant C is vaporized with heat from the electronic components 4a, and the electronic components 4a are cooled with heat of vaporization.

When the coolant C is vaporized as described above, the vapor V of the coolant C occurs in the immersion tank 11, and the vapor V is introduced through the steam tube 12 into the condenser tube 13.

The condenser tube 13 is part of a cooling unit 18 which cools the coolant C, cooling and condensing the vapor V in the tube with cooling water supplied to the cooling unit 18.

The coolant C condensed and liquefied as described above flows out from a termination end of the condenser tube 13, and is temporarily stored in the coolant tank 14.

In this example, the coolant tank 14 is provided with a hole 14a through which air passes, thereby maintaining the inner pressure of the coolant tank 14 at atmospheric pressure.

The coolant C inside the coolant tank 14 passes through the liquid tube 15 to return to the immersion tank 11 again.

According to the cooling device 10 described above, the hole 14a of the coolant tank 14 invariably maintains the pressure inside the coolant tank 14 and the immersion tank 11 communicating thereto at atmospheric pressure, and thus the immersion tank 11 and the coolant tank 14 do not have to have a pressure-resistant structure.

With the hole 14a having a small diameter, it is thought that reduction in vapor of the coolant C leaked from the hole 14a to the outside and reduction in natural dissipation of the coolant C in the coolant tank 14 are possible.

With the coolant tank 14 having a narrow cylindrical shape, it is thought that an area of contact between the coolant C and air inside the coolant tank 14 is decreased and reduction in natural dissipation of the coolant C is possible.

However, according to a study of the inventor, it has been revealed that vapor of the coolant C is leaked from the hole 14a more than assumed.

Figure 3A:
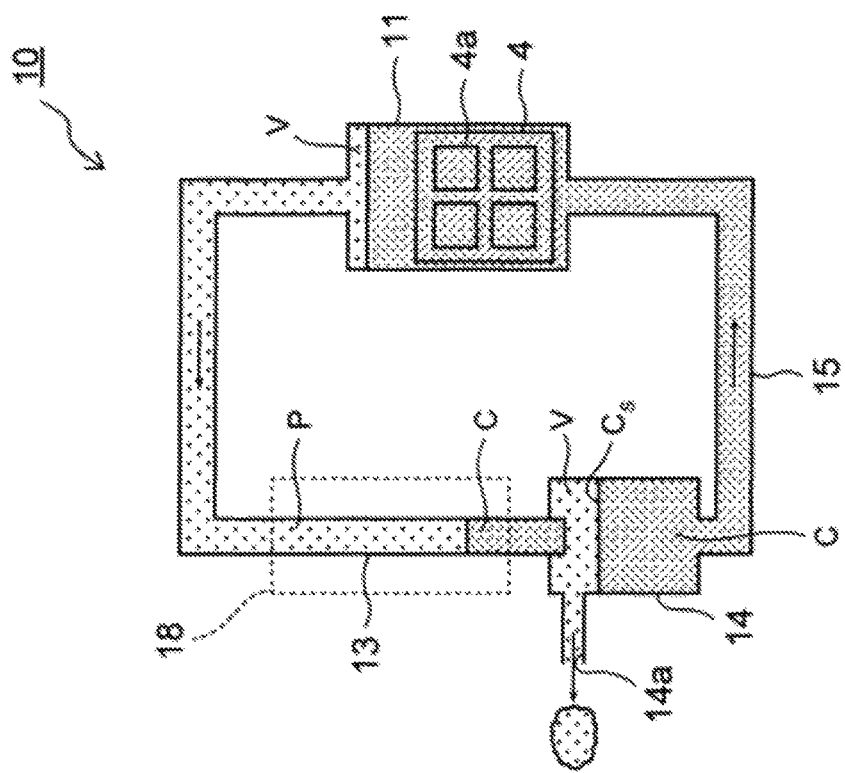
FIG. 3A and FIG. 3B are schematic diagrams for describing a cause for leakage of vapor of a coolant in the cooling device of FIG. 2.
Figure 3B:
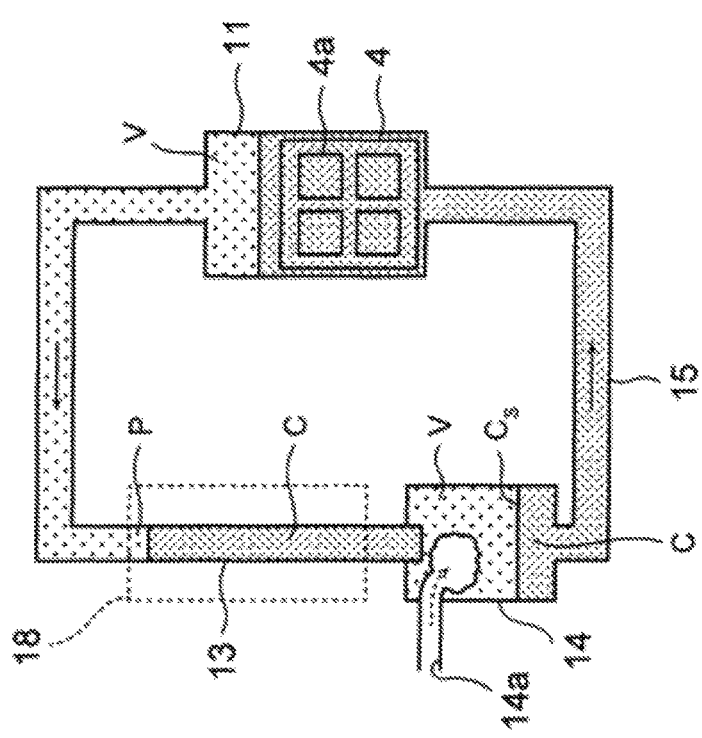

FIG. 3A and FIG. 3B are schematic diagrams of the cooling device 10 for describing a cause for leakage described above. In FIG. 3A and FIG. 3B, each unit of the cooling device 10 is simplified for easy understanding of the drawings.

As depicted in FIG. 3A and FIG. 3B, in the cooling device 10, it has been revealed that a state in which the amount of the coolant C in a liquid phase in the cooling tubes 5 is large (FIG. 3A) and a state in which the amount of the coolant C in the liquid phase in the cooling tubes 5 is small (FIG. 3B) repeatedly occur.

This is because a pressure P inside the cooling tubes 5 is unstable and the pressure P fluctuates to cause fluctuation of the amount of the coolant C inside the cooling tubes 5.

When the amount of the coolant C fluctuates inside the cooling tubes 5, the amount of the coolant C inside the coolant tank 14 also fluctuates in conjunction therewith, and a liquid surface $C_s$ of the coolant C goes up and down.

For example, in the course of a change of the cooling device 10 from the state in FIG. 3B to the state in FIG. 3A, the amount of the coolant C supplied to the coolant tank 14 falls below the amount of the coolant C flowing out from the coolant tank 14, and thus the liquid surface $C_s$ of the coolant C decreases.

In this case, the decrease of the liquid surface $C_s$ causes air to flow from the hole 14a into the coolant tank 14, but does not do any actual harm.

On the other hand, in the course of a change of the cooling device 10 from the state in FIG. 3A to the state in FIG. 3B, the amount of the coolant C supplied to the coolant tank 14 exceeds the amount of the coolant C flowing out from the coolant tank 14, and thus the liquid surface $C_s$ of the coolant C increases.

With the increase of the liquid surface $C_s$, air including the naturally-evaporated coolant C is leaked from the coolant tank 14 via the hole 14a to the outside.

As a result, the expensive coolant C has to be replenished, thereby increasing the running cost of the cooling device 10.

In the following, embodiments allowing reduction of an escape of the naturally-evaporated coolant into the air as described above are described.

First Embodiment

Figure 4:
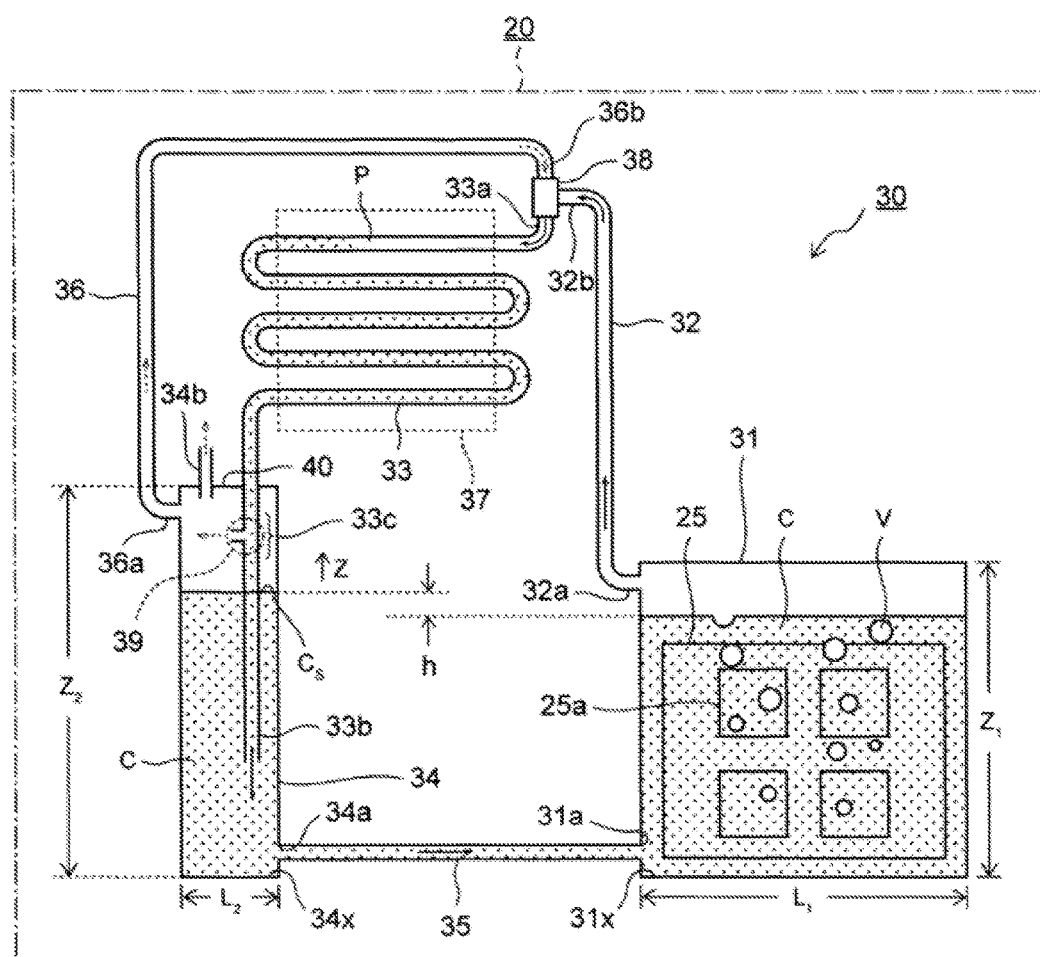
FIG. 4 is a structure diagram of an electronic device according to a first embodiment.

FIG. 4 is a structure diagram of an electronic device according to a first embodiment.

An electronic device 20 has a circuit board 25 and a cooling device 30 for cooling the circuit board 25.

The circuit board 25 is an example of an electronic unit for, by way of example, calculators such as servers and supercomputers.

The cooling device 30 uses a gas-liquid phase change of a coolant, and has an immersion tank 31, a steam tube 32, a condenser tube 33, a coolant tank 34, a liquid tube 35, and an air tube 36.

The immersion tank 31 is a container for storing the insulating coolant C. On a side wall of the immersion tank 31, a supply port 31a for supplying the coolant C in the liquid phase to the immersion tank 31 is provided.

The shape and size of the immersion tank 31 are not particularly limited. In this example, the immersion tank 31 is assumed to have a shape of a rectangular parallelepiped having a length $L_1$ of 180 mm, an inner height $Z_1$ of 230 mm, and a width of 50 mm. To allow observations of the inside of the immersion tank 31, the immersion tank 31 is fabricated of, for example, a transparent acrylic board having a thickness of 5 mm.

However, the material of the immersion tank 31 is not limited to the above, and a strong engineering plastic having a thin thickness may be used as a material of the immersion tank 31. Examples of this engineering plastic are a polycarbonate resin, an acrylonitrile butadiene styrene (ABS) resin, a poly phenylene sulfide (PPS) resin, and so forth. These engineering plastics have light weights and are thus advantageous in weight reduction of the entire device, and are also inexpensive and thus allow price reduction of the device.

The immersion tank 31 may be fabricated by sheet metal working on a thin stainless steel plate or aluminum plate.

The type of the coolant C stored in the immersion tank 31 is not particularly limited. In this example, Novec 7100 made by 3M and having a low boiling point and low viscosity is used as the coolant C. In place of Novec 7100, Novec 7000 or Novec 649 may be used. Novec is a chemically-stable, fluorine-based coolant, and does not have a danger of corroding various materials such as metal and resin. Novec does not have a burning point, and thus high safety is another advantage.

In the coolant C, the circuit board 25 is immersed.

The size of the circuit board 25 is not particularly limited. In this example, the circuit board 25 for use has a square shape with each side being 170 mm. The coolant C is injected into the immersion tank 31 to the extent that the circuit board 25 is fully immersed, and thus the height of the liquid surface of the coolant C immediately after injection is on the order of 170 mm from a bottom surface 31x of the immersion tank 31.

On the circuit board 25, four electronic components 25a such as CPUs which generate heat at the time of operation are implemented. Each electronic component 25a has a heating value on the order of 100 W, and one circuit board 25 thus has a heating value on the order of 400 W (=4×100 W).

The size of the electronic component 25a is not particularly limited. For example, a CPU with each side being on the order of 45 mm may be used as the electronic component 25a.

Since the coolant C is insulative, there is no danger that the circuit board 25 and the electronic components 25a are short-circuited by the coolant C.

Since the heat generation temperature of the electronic components 25a is higher than the boiling point of the coolant C, the coolant C is vaporized with the heat from the electronic components 25a, and the electronic components 25a are cooled with the heat of vaporization. With the coolant C vaporized as described above, vapor V occurs at the immersion tank 31.

The vapor V is introduced through the steam tube 32 into the condenser tube 33.

The steam tube 32 is, for example, a resin tube having a diameter of ⅜ inches, with its starting end 32a connected to the immersion tank 31 and its termination end 32b connected to a connecting part 38, which will be described further below.

Meanwhile, the condenser tube 33 is part of a condensing unit 37 which cools and condenses the coolant C, cooling and condensing the vapor V in the tube with cooling water supplied to the condensing unit 37. Any temperature of cooling water lower than the boiling point of the coolant C is usable, for example, 15° C.

To promote heat exchange between cooling water and the vapor V, a plurality of grooves may be provided to an inner wall of the condenser tube 33 to increase a surface area of the inner wall.

In this example, the connecting part 38 is provided at a starting end 33a of the condenser tube 33, and the termination end 32b of the steam tube 32 is connected to the connecting part 38, thereby introducing the vapor V from the termination end 32b to the inside of the condenser tube 33.

The coolant C condensed in the condenser tube 33 is discharged from a termination end 33b of the condenser tube 33 as being in a supercooling state at a temperature lower than the boiling point of the coolant C.

In this example, the termination end 33b is provided at a position lower than the connecting part 38, thereby allowing the liquefied coolant C to smoothly pass through the condenser tube 33.

The shape of the condenser tube 33 is not particularly limited. However, it is preferable to use a meandering pipe as the condenser tube 33, thereby promoting heat exchange between cooling water and the vapor V. The meandering pipe may be fabricated by, for example, connecting ten copper-made straight tubes each having a length of 150 mm and an outer diameter of 8 mm via U-shaped tubes.

A midway part 33c of the condenser tube 33 is provided with an isolating part 39. The midway part 33c is a portion where the coolant C in the liquid phase passes in the condenser tube 33, and extends along a vertical direction Z.

The isolating part 39 isolates the condensed coolant C in the liquid phase from air, and takes out air after isolation to the outside of the condenser tube 33. The coolant C in the liquid phase isolated from air by the isolating part 39 is discharged from the termination end 33b of the condenser tube 33.

Meanwhile, the coolant tank 34 temporarily stores the coolant C discharged from the condenser tube 33, and accommodates therein the termination end 33b of the condenser tube 33 and the isolating part 39.

The isolating part 39 is positioned higher than the liquid surface $C_s$ of the coolant C, and thus the coolant C in the liquid phase in the coolant tank 34 does not enter the condenser tube 33 from the isolating part 39.

The coolant tank 34 includes a plate 41 for partition between the inside and the outside, and the plate 41 is provided with a hole 34b through which air passes. The hole 34b brings the inside of the coolant tank 34 into a state of being open to the air, and the pressure inside the coolant tank 34 and the immersion tank 31 communicating thereto are maintained at atmospheric pressure. Thus, even if the vapor V of the coolant C occurs inside the immersion tank 31 due to heat from the electronic components 25a, the inner pressure of the immersion tank 31 and the coolant tank 34 does not become higher than atmospheric pressure, and the immersion tank 31 and the coolant tank 34 do not have to have a pressure-resistant structure.

This allows a light-weight, low-cost material such as an engineering plastic to be used as a material of the immersion tank 31 and the coolant tank 34, thereby allowing low cost of the cooling device 30.

The coolant C discharged from the termination end 33b of the condenser tube 33 is in a supercooling state as described above, and thus has a low temperature and is less prone to evaporate immediately upon exposure to air. Thus, even if the hole 34b is provided to the coolant tank 34 as described above, vapor of the coolant C escaping to the outside through the hole 34b may be decreased.

The hole 34b also has a function as a supply port for supplying the coolant C to the inside of the coolant tank 34. In the first embodiment, the hole 34b has a small diameter of 10 mm, thereby decreasing the amount of vapor of the coolant C escaping to the outside through the hole 34b.

To the coolant tank 34, a starting end 36a of the air tube 36 is connected. A termination end 36b of the air tube 36 is connected to the connecting part 38, thereby supplying air in the coolant tank 34 to the starting end 33a of the condenser tube 33 via the air tube 36.

As a result, the inside of the condenser tube 33 is invariably maintained at atmospheric pressure, as in the coolant tank 34, thereby avoiding fluctuations of the pressure P inside the condenser tube 33.

The size of the coolant tank 34 is not particularly limited. For example, the coolant tank 34 has an inner height $Z_2$ of 400 mm. The shape of the coolant tank 34 when viewed from above is assumed to be a square shape with each side length $L_2$ being 50 mm.

The length $L_2$ may be further shortened to decrease a contact area between the coolant C and air inside the coolant tank 34 to decrease the amount of the naturally-evaporated coolant C in the coolant tank 34.

On a lower portion of the coolant tank 34, a discharge port 34a for discharging the coolant C in the liquid phase is provided.

The discharge port 34a is coupled to the supply port 31a of the immersion tank 31 via the liquid tube 35. The coolant C is supplied from the coolant tank 34 via the liquid tube 35 to the immersion tank 31.

If the vapor V does not occur in the immersion tank 31, atmospheric pressure is equally applied to the liquid surface of the coolant C in each of the immersion tank 31 and the coolant tank 34, and the liquid surface of the immersion tank 31 and the coolant tank 34 have the same height.

On the other hand, if the vapor V occurs in the immersion tank 31, the liquid surface of the coolant C in the immersion tank 31 decreases, and the liquid surface $C_s$ of the coolant C in the coolant tank 34 increases, thereby causing a height difference h between the respective liquid surfaces.

In the first embodiment, a pressure difference $\Delta P = \rho g h$ occurring from the height difference h serves as a power source for supplying the coolant C from the coolant tank 34 to the immersion tank 31, and thus no power source is provided such as a pump for circulating the coolant C. $\rho$ represents density of the coolant C, 1520 kg/m³ for Novec 7100. "g" represents acceleration of gravity.

As the height difference h is larger, the pressure difference $\Delta P (=\rho g h)$ is larger. This makes the coolant C easily circulate inside the cooling device 30. For example, consider a case in which the bottom surface 31x of the immersion tank 31 and a bottom surface 34x of the coolant tank 34 are set to be equal in height to each other and the liquid surface of the coolant C in the immersion tank 31 is at a height of 230 mm from the bottom surface 31x. When the liquid surface $C_s$ of the coolant C in the coolant tank 34 is at a height of 400 mm from the bottom surface 34x, the height difference h is 170 mm (=400 mm−230 mm), and the pressure difference $\Delta P$ on the order of 2.5 kPa may be acquired.

To acquire a large height difference h, it is preferable to allocate a space which allows the liquid surface $C_s$ to increase inside the coolant tank 34. To allocate this space, it is preferable to make the inner height $Z_2$ of the coolant tank 34 higher than the inner height $Z_1$ of the immersion tank 31.

Next, the structure of the connecting part 38 of the condenser tube 33 described above is described.

FIG. 5A is a perspective view of the connecting part 38.

As depicted in FIG. 5A, the starting end 33a of the condenser tube 33 is provided with a swelling part 33x in a cylindrical shape having a diameter larger than those of the other parts of the condenser tube 33.

The swelling part 33x is coaxial with the termination end 36b of the air tube 36, and externally surrounds the termination end 36b.

To the outer surface of the swelling part 33x, the termination end 32b of the steam tube 32 described above is connected.

FIG. 5B is a top view of the connecting part 38 when viewed from an axial direction VB of the condenser tube 33.

As depicted in FIG. 5B, in the first embodiment, the steam tube 32 is connected to the swelling part 33x of the condenser tube 33 so that a center axis 32c of the steam tube 32 goes out of a center 33c of the condenser tube 33.

This causes a swirl flow of the vapor V in the condenser tube 33, as depicted in FIG. 5A. The vapor V has a specific gravity higher than that of air, and thus flows along the inner surface of the condenser tube 33 by a centrifugal force with the swirl flow.

As a result, heat exchange is promoted between cooling water outside the condenser tube 33 and the vapor V, allowing the vapor V to be efficiently cooled by cooling water.

Next, the structure of the above-described isolating part 39 is described.

Figure 6:
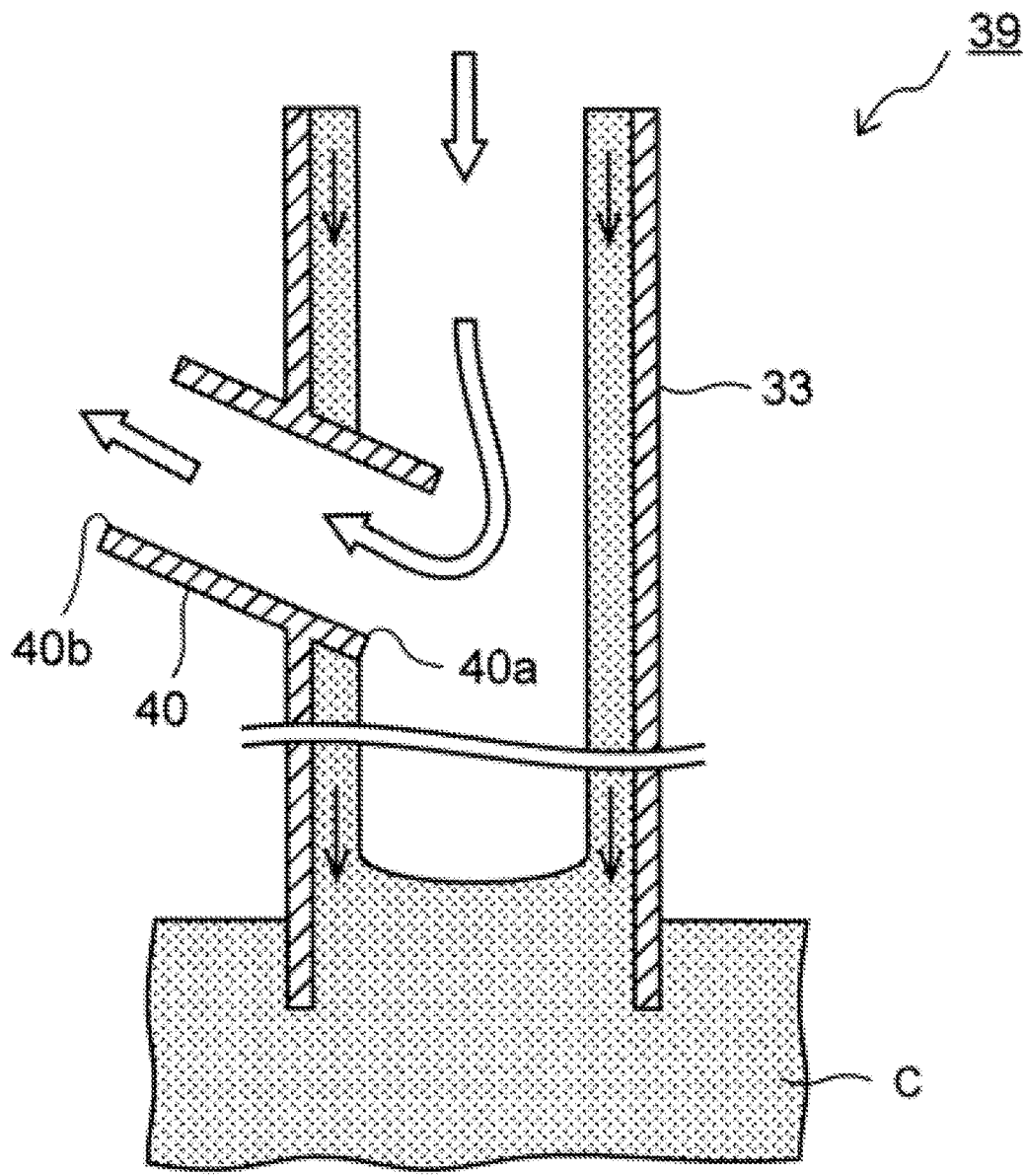
FIG. 6 is a sectional view of an isolating part according to the first embodiment.

FIG. 6 is a sectional view of the isolating part 39.

As depicted in FIG. 6, to the condenser tube 33 in the isolating part 39, a tube 40 oriented diagonally above with respect to the vertical direction is connected.

The tube 40 includes a first opening end 40a positioned inside the condenser tube 33 and a second opening end 40b positioned higher than the first opening end 40a outside the condenser tube 33.

With the tube 40 set diagonally to change the heights of the first and second opening ends 40a and 40b, the coolant C in the liquid phase in the condenser tube 33 is avoided from entering the tube 40, and only air inside the condenser tube 33 is allowed to be taken out via the tube 40 to the outside.

Since the coolant C in the liquid phase flows down along the tube wall of the condenser tube 33, air flows near the center of the condenser tube 33. Thus, as depicted in FIG. 6, preferably, with the first opening end 40a of the tube 40 protruding toward inside the condenser tube 33, the coolant C in the liquid phase is avoided from entering the inside of the tube 40, and air flowing near the center of the condenser tube 33 is easily taken into the tube 40.

According to the cooling device 30 described above, as depicted in FIG. 4, the coolant tank 34 and the starting end 33a of the condenser tube 33 are connected via the air tube 36, thereby allowing reduction in fluctuations of the pressure P inside the condenser tube 33. As a result, unlike the example depicted in FIG. 3A and FIG. 3B, the liquid surface $C_s$ less goes up and down inside the coolant tank 34 due to fluctuations of the pressure P, thereby allowing reduction in leakage of air including the naturally-evaporated coolant C from the coolant tank 34 via the hole 34b to the outside.

As a result, the number of times of replenishment of the expensive coolant C to the coolant tank 34 may be decreased, and the running cost of the cooling device 30 may be reduced.

The inventor has verified the cooling performance of the cooling device 30 by operating each electronic component 25a.

As a result, when the heating value of one electronic component 25a was 30 W and the total heating value of one circuit board 25 was 120 W (=4×30 W), the temperature of one electronic component 25a was 70° C. When the heating value of one electronic component 25a was 60 W and the total heating value was 240 W (=4×60 W), the temperature of one electronic component 25a was 75° C.

When the heating value of one electronic component 25a was 100 W and the total heating value was 400 W (=4×100 W), the temperature of one electronic component 25a was 79° C.

These temperatures of the electronic components 25a were substantially equal to those in the example of FIG. 2 without provision of the air tube 36. From this, it has been confirmed that the air tube 36 does not inhibit the cooling performance of the cooling device 30.

In this verification, Novec 7100 having a boiling point of 61° C. was used as the coolant C. If the temperatures of the electronic components 25a are desired to be further decreased, a product having a lower boiling point, such as Novec 649 (boiling point of 49° C.) or Novec 7000 (boiling point of 34° C.), is used as the coolant C.

The first embodiment is not limited to the above.

Figure 7:
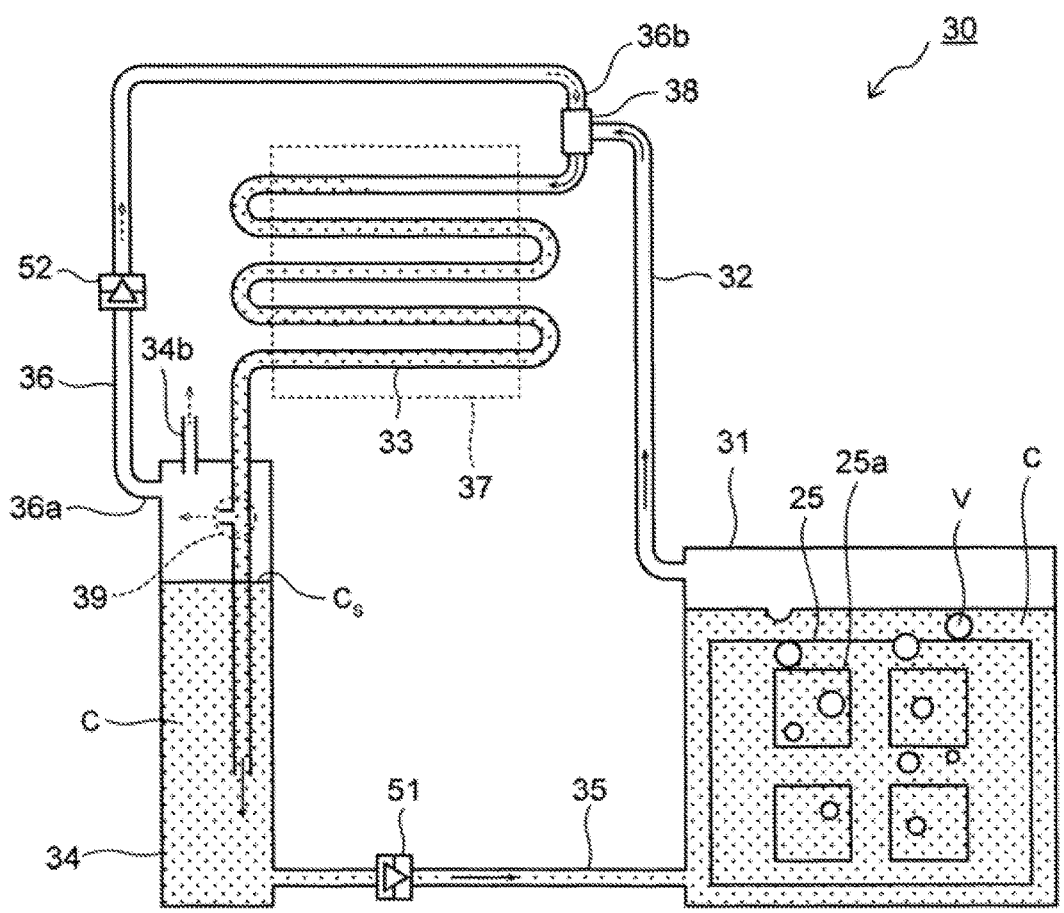
FIG. 7 is a structure diagram of a cooling device according to a modification example of the first embodiment.

FIG. 7 is a structure diagram of a cooling device according to a modification example of the first embodiment.

In FIG. 7, components identical to those described with reference to FIG. 4 are provided with the same reference characters in FIG. 4, and are not described below.

As depicted in FIG. 7, in the present modification example, a first check valve 51 is provided to the liquid tube 35, and a second check valve 52 is provided to the air tube 36.

The first check valve 51 avoids a backflow of the coolant C in the liquid phase from the immersion tank 31 to the coolant tank 34.

This allows avoidance of a backflow of the coolant C from the immersion tank 31 to the coolant tank 34 to increase the liquid surface $C_s$ in the coolant tank 34 and avoidance of air containing vapor of the coolant C from escaping through the hole 34b with an increase of the liquid surface $C_s$.

Meanwhile, the second check valve 52 avoids a backflow of air from the termination end 36b to the starting end 36a of the air tube 36.

Depending on the amount of the coolant C in the liquid phase stored inside the condenser tube 33, the termination end 36b of the air tube 36 may temporarily have a pressure higher than that of the starting end 36a.

Also in this case, by providing the second check valve 52 to the air tube 36 as described above, a backflow of the vapor V at high temperatures occurring at the immersion tank 31 through the air tube 36 to reach the coolant tank 34 may be avoided.

As a result, the vapor V may be avoided from escaping to the outside through the hole 34b, and the coolant C inside the coolant tank 34 may be avoided from being heated with the vapor V at high temperatures.

It has been verified by the inventor that the cooling performance of the cooling device 30 even provided with the first check valve 51 and the second check valve 52 as described above is substantially the same as that of the first embodiment (FIG. 4).

The inventor also conducted a study as to how much degree fluctuations of the height of the liquid surface $C_s$ is reduced in the first embodiment (FIG. 4) and its modification example (FIG. 7).

Figure 8:
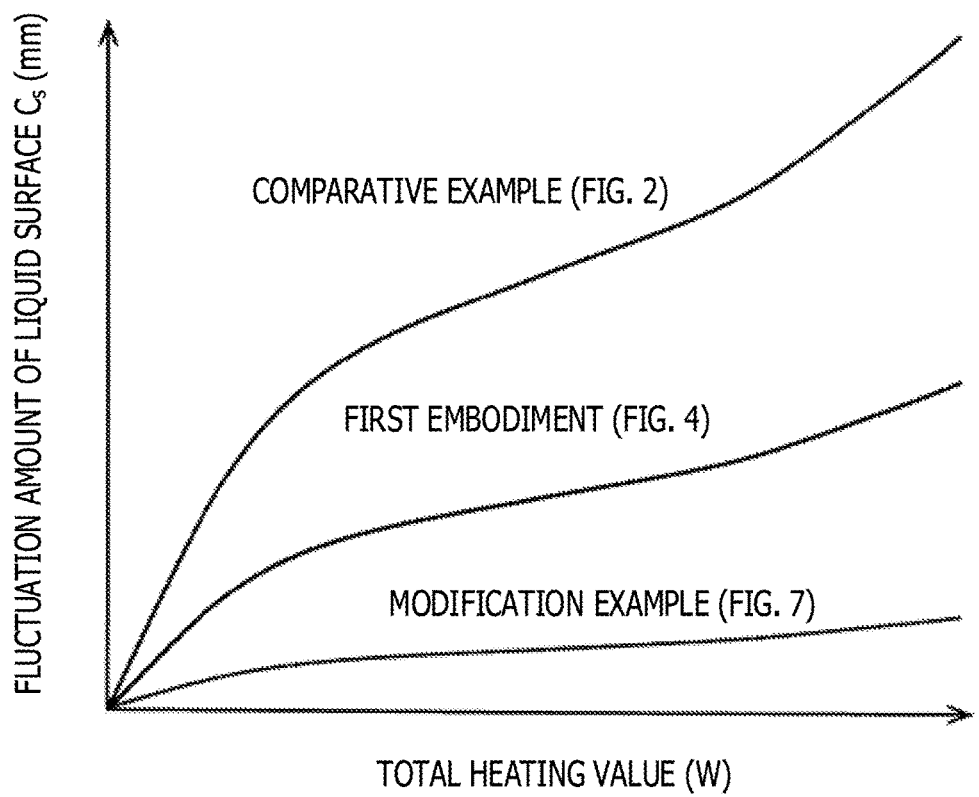
FIG. 8 is a diagram depicting results of a study as to how much degree fluctuations of the height of a liquid surface in a coolant tank is reduced in the first embodiment and its modification example.

The results of the study are depicted in FIG. 8.

The horizontal axis of FIG. 8 represents a total heating value (W) of all electronic components 25a immersed in the immersion tank 31. The vertical axis of FIG. 8 represents a fluctuation amount (mm) of the liquid surface $C_s$.

In this study, the cooling device 10 of FIG. 2 was used as a comparative example, and the study was conducted also on the comparative example.

As depicted in FIG. 8, in the first embodiment (FIG. 4), it has been revealed that even if the heating value of the electronic components 25a increases to cause a large amount of the vapor V to occur inside the immersion tank 31, fluctuations of the liquid surface $C_s$ are reduced to approximately ½ of those in the comparative example (FIG. 2). The reason for this may be that, as described above, fluctuations of the pressure inside the condenser tube 33 were reduced by the air tube 36.

In the modification example (FIG. 7), fluctuations of the liquid surface $C_s$ are reduced to approximately ⅕ of those in the comparative example (FIG. 2), which is more than the first embodiment (FIG. 4). From this, it has been confirmed that providing the first check valve 51 and the second check valve 52 is as in the comparative example is effective in reducing fluctuations of the liquid surface $C_s$.

Based on the study results of FIG. 8, the inventor calculated an annual dissipation amount of the coolant C when the cooling device is driven for eight hours per day. The calculation results are depicted in FIG. 9.

Figure 9:
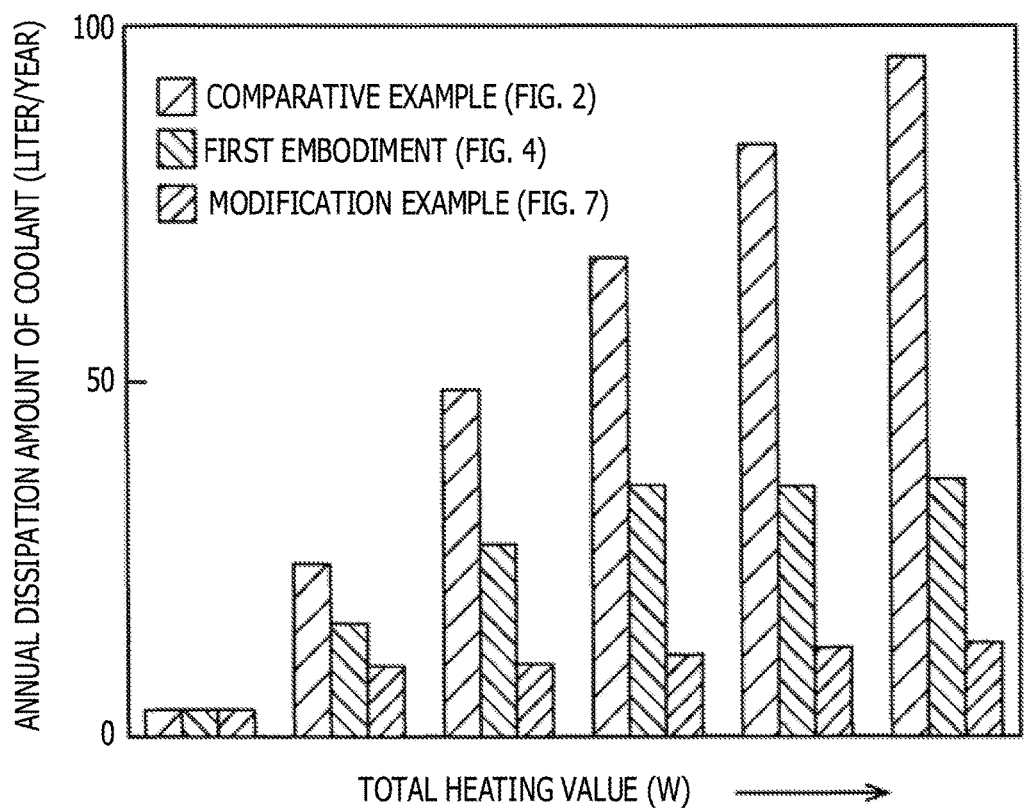
FIG. 9 is a diagram depicting calculation results of annual dissipation amount of the coolant in the first embodiment and its modification example.

The horizontal axis of FIG. 9 represents a total heating value (W) of all electronic components 25a immersed in the immersion tank 31. The vertical axis of FIG. 9 represents an annual dissipation amount (liter/year) of the coolant C in the liquid phase.

As depicted in FIG. 9, it has become evident that the dissipation amount of the coolant C may be reduced in both of the first embodiment (FIG. 4) and the modification example (FIG. 7) more than the comparative example (FIG. 2).

Specifically, in the first embodiment (FIG. 4) and the modification example (FIG. 7), it has become evident that the dissipation amount of the coolant C merely mildly increases even if the heating value (W) of the electronic components 25a increases, for example. From this, it has become evident that the first embodiment (FIG. 4) and the modification example (FIG. 7) are more effective when heat generation of the electronic components 25a increases.

Second Embodiment

In a second embodiment, an immersion tank with good maintainability is described.

Figure 10:
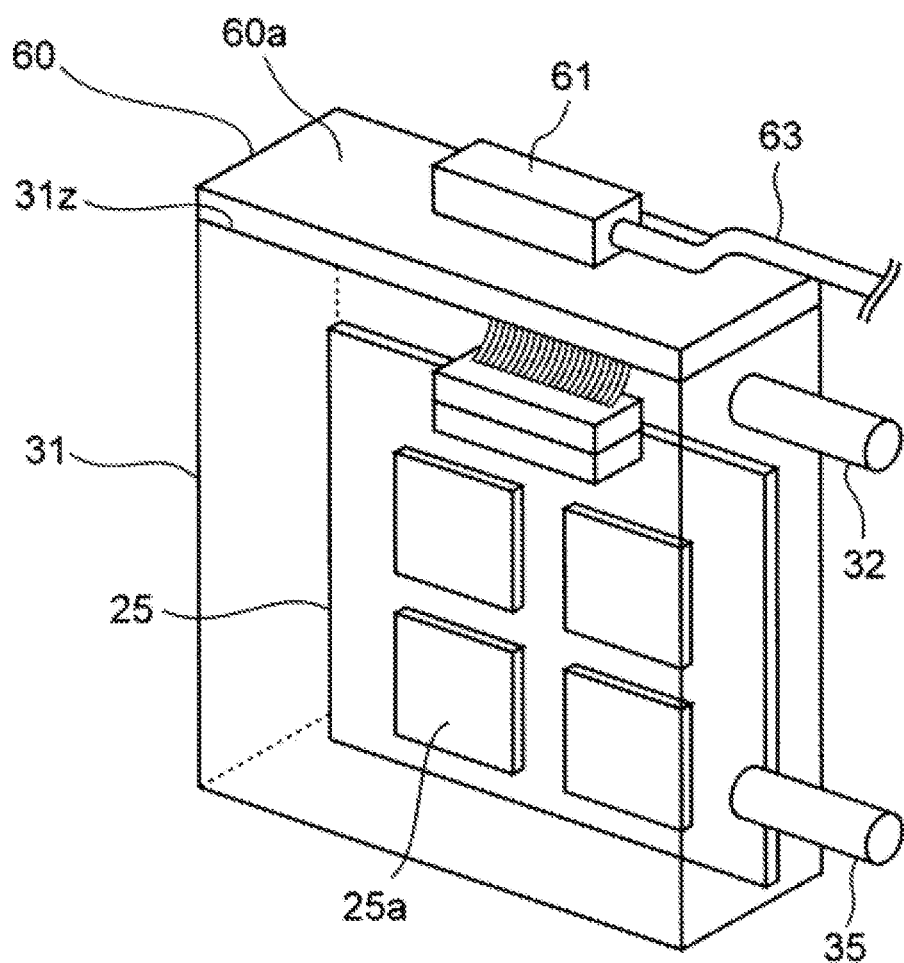
FIG. 10 is a perspective view of an immersion tank according to a second embodiment.

FIG. 10 is a perspective view of an immersion tank 31 according to the second embodiment. In FIG. 10, components identical to those described in the first embodiment are provided with the same reference characters in the first embodiment, and are not described below.

As depicted in FIG. 10, in the second embodiment, a cover 60 attachable and detachable to an upper opening 31z of the immersion tank 31 is provided.

The cover 60 has a rectangular shape to cover the upper opening 31z in a planar view, and has an outer surface 60a provided with an external connector 61. To the external connector 61, a tip of an external cable 63 is fixed.

Figure 11:
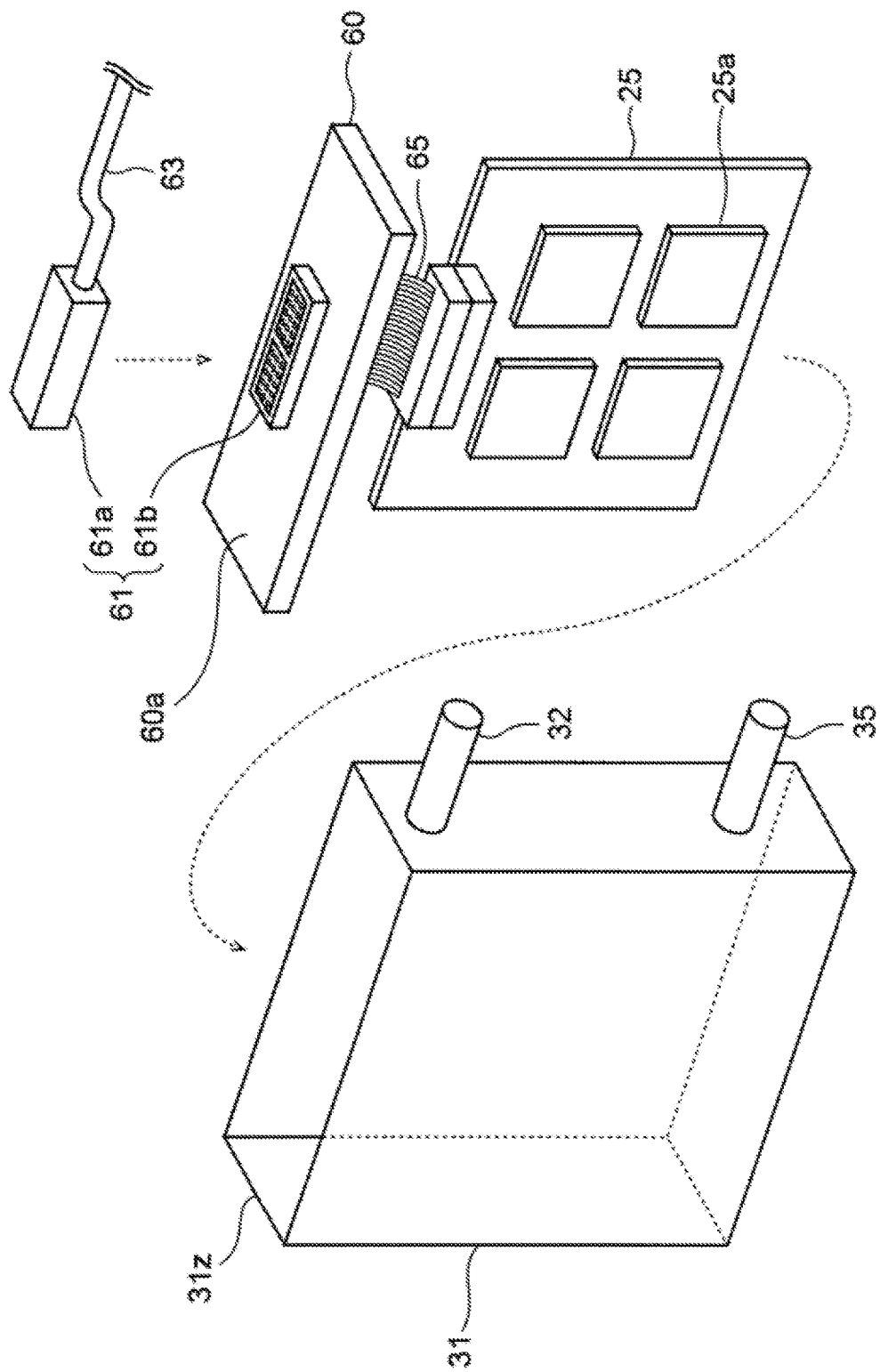
FIG. 11 is an exploded perspective view of the immersion tank according to the second embodiment.

FIG. 11 is an exploded perspective view of the immersion tank 31.

As depicted in FIG. 11, the external connector 61 has a male connector 61a and a female connector 61b attachable and detachable to each other.

The female connector 61b is fixed to the outer surface 60a of the cover 60, and is electrically connected via a cable 65 to the circuit board 25.

An upper opening 31z of the immersion tank 31 has a size allowing the circuit board 25 to be loaded and unloaded, and the circuit board 25 is allowed to be loaded into and unloaded from the immersion tank 31 through the upper opening 31z.

According to the second embodiment described above, with the attachable and detachable cover 60 provided to the immersion tank 31, the cover 60 is allowed to be detached to allow the circuit board 25 to be easily pulled up from the immersion tank 31, thereby improving maintainability of the immersion tank 31.

With the external connector 61 and the circuit board 25 connected to each other via the cable 65, signal transmission and reception are allowed to be performed between the outside of the immersion tank 31 and the circuit board 25 even if the circuit board 25 is accommodated in the immersion tank 31.

Third Embodiment

Figure 12:
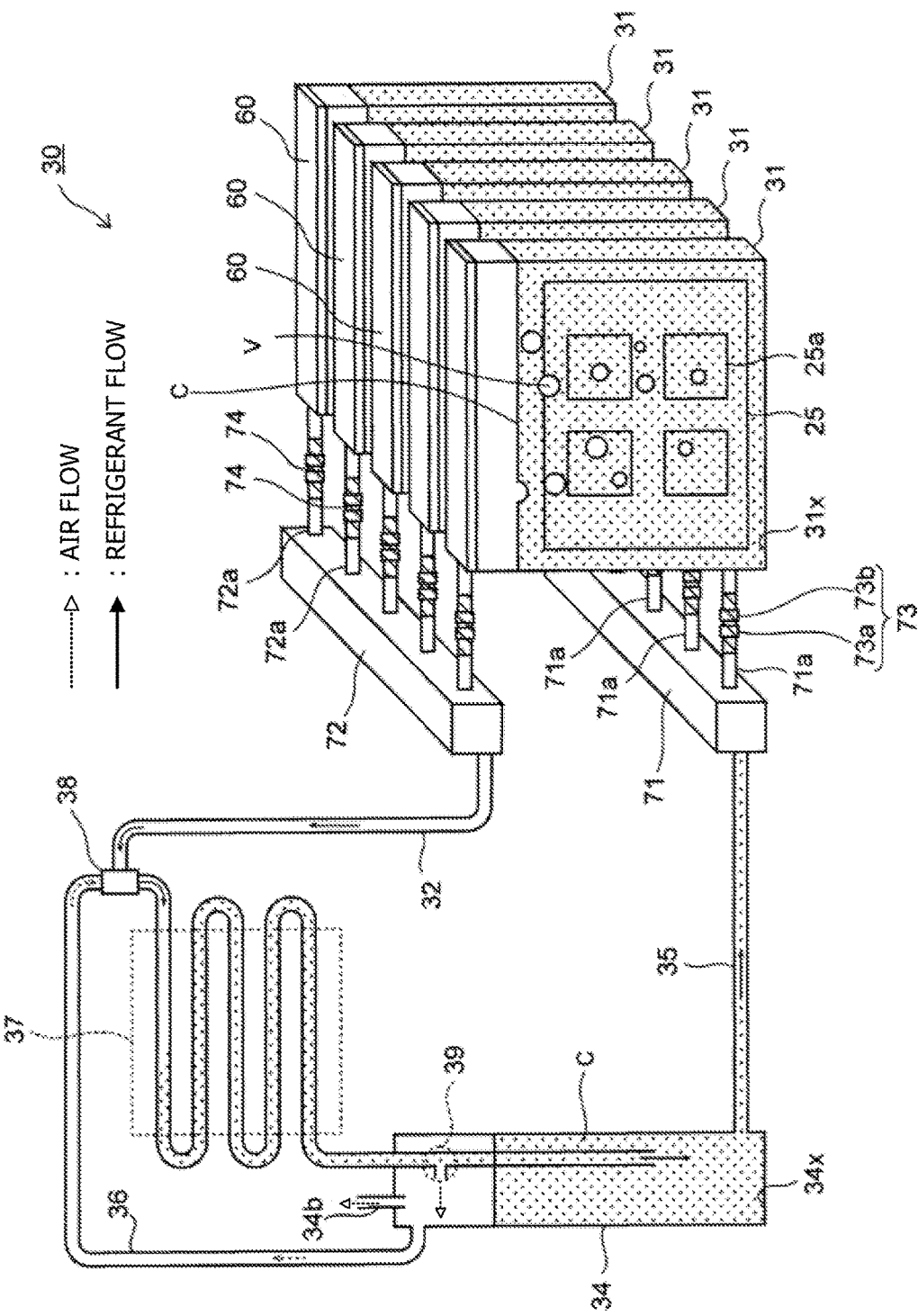
FIG. 12 is a structure diagram of a cooling device according to a third embodiment.

FIG. 12 is a structure diagram of a cooling device according to a third embodiment. In FIG. 12, components identical to those described in the first and second embodiments are provided with the same reference characters in these embodiments, and are not described below.

As depicted in FIG. 12, in the cooling device 30 according to the third embodiment, a plurality of immersion tanks 31 are connected in parallel. Any plural number of immersion tanks 31 suffices, and the number of immersion tanks 31 in this example is five.

To the liquid tube 35, a first manifold 71 is connected, which branches the coolant C in the liquid phase to each of the plurality of immersion tanks 31 from the coolant tank 34. The first manifold 71 has a plurality of first branch pipes 71a, and each of the first branch pipes 71a is connected to a relevant one of the immersion tanks 31 via a first joint 73.

The size of the first manifold 71 is not particularly limited. In this example, it is assumed that the first manifold 71 has a lateral width of on the order of 400 mm and a flow path of the first manifold 71 of a portion to be connected to the liquid tube 35 has a cross-sectional area on the order of 40 $mm^2$.

The first joint 73 has a stem 73a and a body 73b that are attachable and detachable. Even if these are isolated, the coolant C is not leaked from the first joint 73, and thus maintenance is easy as the immersion tank 31 is isolated from the first manifold 71. As this joint, for example, SS-QC6-B-600 or SS-QC6-D-600 made by Swagelok Company may be used.

As the first branch pipe 71a, for example, a resin tube having an outer shape of ⅜ inches may be used.

To each of the plurality of immersion tanks 31, a second manifold 72 is connected, which gathers the vapor V of the coolant C occurring at each immersion tank 31 for supply to the steam tube 32. The second manifold 72 has a plurality of second branch pipes 72a, and each of the second branch pipes 72a is connected to a relevant one of the immersion tanks 31 via a second joint 74.

As the second manifold 72, the second branch pipes 72a, and the second joints 74, those identical to the first manifold 71, the first branch pipes 71a, and the first joints 73 may be used.

The number of circuit boards 25 to be immersed into each immersion tank 31 is assumed to be one. One circuit board 25 may configure a server, or one circuit board 25 may configure one computation node of a super computer.

Each immersion tank 31 is provided with the attachable and detachable cover 60 described in the second embodiment.

The position and size of each component are the same as those of the first embodiment. For example, the bottom surfaces 31x and 34x of the immersion tank 31 and the coolant tank 34 are positioned at the same height, and the coolant tank 34 has an inner height of 400 mm, and the immersion tank 31 has an inner height of 230 mm. According to a trial calculation by the inventor, with these sizes, the coolant C may be circulated inside the cooling device 30 even if the heating value of one circuit board 25 is 100 W and a total heating value of five circuit boards 25 is 500 W at maximum.

According to the third embodiment described above, when only one of the plurality of circuit boards 25 is subjected to maintenance, the cover 60 of the immersion tank 31 accommodating the circuit board 25 is removed to expose only the relevant immersion tank 31 to air.

Thus, the cover 60 of the immersion tank 31 accommodating the operating circuit board 25 not as a maintenance target is left closed, thereby allowing avoidance of a large amount of the coolant C vaporized by heat from the circuit board 25 from escaping into the air.

In the immersion tank 31 accommodating the circuit board 25 not as a maintenance target, the circuit board 25 is kept cooled with the coolant C, thereby allowing the operating state of the circuit board 25 to be kept.

Specifically, when each of the plurality of circuit boards 25 is a computation node of one supercomputer, a computation node not as a maintenance target is operated, thereby allowing the supercomputer itself to be kept operated, for example.

The inventor studied the cooling performance of the cooling device 30 by operating each of the electronic components 25a.

In this study, one circuit board 25 constructed one server, and the heating value of one electronic component 25a was set at 25 W. In this case, the heating value of one server is 100 W (=4×25 W), and the heating value of all five servers is 500 W (=5×100 W).

When the cooling device 30 was operated under the above-described conditions, the temperature of one electronic component 25a was on the order of 70° C. This temperature was substantially equal to that in the example of FIG. 2 where the air tube 36 is not provided. From this, it has been confirmed that the air tube 36 does not inhibit the cooling performance of the cooling device 30 even if the plurality of immersion tanks 31 are provided in parallel as in the third embodiment.

Fourth Embodiment

As described in the first embodiment, the driving force of the coolant C circulating inside the cooling device resides in the pressure difference $\Delta P$ ($=\rho gh$) due to the height difference h between the liquid surfaces in the immersion tank 31 and the coolant tank 34. As the height difference h is larger, the driving force of the coolant C circulating inside the cooling device is larger.

In a fourth embodiment, the structure usable for ensuring the height difference h is described.

Figure 13:
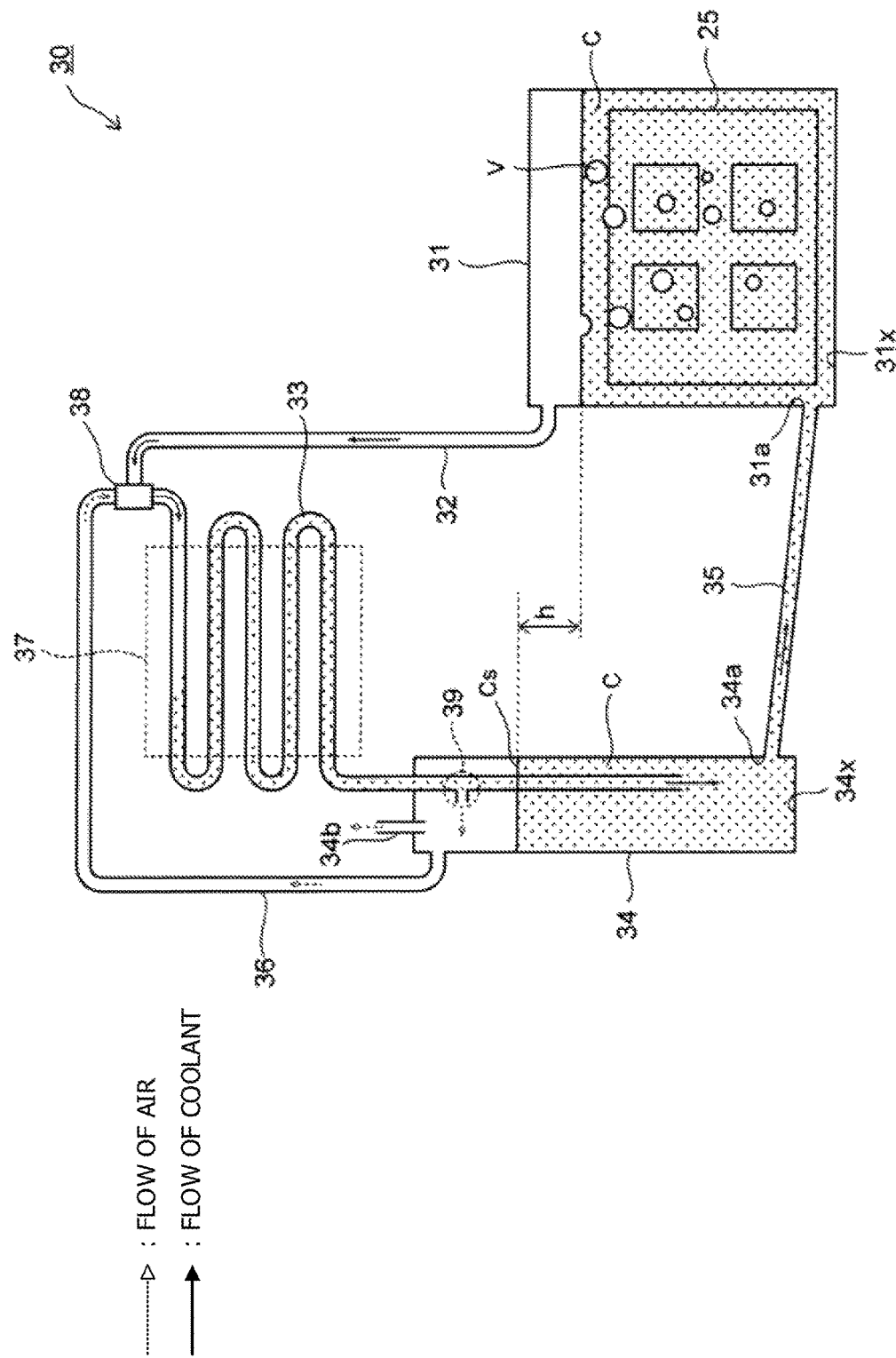
FIG. 13 is a structure diagram of a cooling device according to a fourth embodiment.

FIG. 13 is a structure diagram of a cooling device according to the fourth embodiment. In FIG. 13, components identical to those described in the first to third embodiments are provided with the same reference characters in these embodiments, and are not described below.

As with the first to third embodiments, the coolant C circulates in the cooling device 30 also in the fourth embodiment.

When circulating as described above, the coolant C receives various pressure losses in the cooling device 30. Examples of these pressure losses are a pressure loss when the coolant C in the liquid phase moves through the liquid tube 35, a pressure loss when the vapor V moves through the steam tube 32, and a pressure loss when the coolant C moves inside the condenser tube 33.

The height difference h is defined so that a total sum of these pressure losses matches the above-described pressure difference $\Delta P$.

In the fourth embodiment, the bottom surface 34x of the coolant tank 34 is provided higher than the bottom surface 31x of the immersion tank 31. The discharge port 34a of the coolant tank 34 is positioned higher than the supply port 31a of the immersion tank 31.

With this, the liquid surface $C_s$ of the coolant C in the coolant tank 34 tends to become higher than the liquid surface in the immersion tank 31. As a result, the height difference h between the liquid surfaces is increased, and a driving force that is sufficiently large for the coolant C to circulate inside the cooling device may be ensured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling device comprising:
an immersion tank to store a coolant where an electronic component is immersed and cause the coolant to evaporate by heat from the electronic component into vapor;
a condenser tube including a starting end to which the vapor is supplied and a termination end from which the condensed vapor is discharged;
an isolating part arranged in a midway part of the condenser tube, the isolating part to isolate the condensed coolant from air and take out the air to outside of the condenser tube;
a coolant tank to accommodate the termination end of the condenser tube and the isolating part inside and store the coolant discharged from the condenser tube, the coolant tank including a hole through which air passes;
an air tube that has a starting end coupled to the coolant tank and a termination end coupled to the starting end of the condenser tube, the air tube to supply air from the coolant tank to the condenser tube;
a liquid tube to supply the coolant from the coolant tank to the immersion tank; and
a steam tube to supply the vapor from the immersion tank to the condenser tube.

2. The cooling device according to claim 1, wherein the liquid tube has a first check valve to avoid a backflow of the coolant from the immersion tank to the coolant tank.

3. The cooling device according to claim 1, wherein the air tube has a second check valve to avoid a backflow of air from the termination end of the air tube to the starting end of the air tube.

4. The cooling device according to claim 1, wherein the steam tube is coupled to the starting end of the condenser tube so that a center axis of the steam tube goes out of a center of the condenser tube when viewed from an axial direction of the condenser tube.

5. The cooling device according to claim 1, wherein the midway part of the condenser tube extends along a vertical direction, and
the isolating part has a tube including a first opening end positioned inside the condenser tube in the midway part and a second opening end positioned higher than the first opening end outside the condenser tube in the midway part.

6. The cooling device according to claim 5, wherein the first opening end protrudes toward inside the condenser tube.

7. The cooling device according to claim 1, wherein the immersion tank has an opening allowing the electronic component to be loaded and unloaded, and the opening has an attachable and detachable cover.

8. The cooling device according to claim 7, further comprising:
   a connector fixed to an outer surface of the cover; and
   a cable to couple the connector and the electronic component.

9. The cooling device according to claim 7,
   wherein the cooling device has a plurality of the immersion tanks.

10. The cooling device according to claim 9, further comprising:
    a first manifold coupled to the liquid tube;
    a plurality of first branch pipes coupled to the first manifold to respectively correspond to the plurality of immersion tanks;
    first attachable and detachable joints to respectively couple the plurality of first branch pipes and the plurality of immersion tanks;
    a second manifold coupled to the steam tube;
    a plurality of second branch pipes coupled to the second manifold to respectively correspond to the plurality of immersion tanks; and
    second attachable and detachable joints to respectively couple the plurality of second branch pipes and the plurality of immersion tanks.

11. An electronic device comprising:
    an electronic component; and
    a cooling device to cool the electronic component,
    wherein the cooling device includes
    an immersion tank to store a coolant where the electronic component is immersed and cause the coolant to evaporate by heat from the electronic component into vapor,
    a condenser tube including a starting end to which the vapor is supplied and a termination end from which the condensed vapor is discharged,
    an isolating part arranged in a midway part of the condenser tube, the isolating part to isolate the condensed coolant from air and take out the air to outside of the condenser tube,
    a coolant tank to accommodate the termination end of the condenser tube and the isolating part inside and store the coolant discharged from the condenser tube, the coolant tank including a hole through which air passes,
    an air tube that has a starting end coupled to the coolant tank and a termination end coupled to the starting end of the condenser tube, the air tube to supply air from the coolant tank to the condenser tube,
    a liquid tube to supply the coolant from the coolant tank to the immersion tank, and
    a steam tube to supply the vapor from the immersion tank to the condenser tube.

* * * * *